(12) United States Patent
Simon

(10) Patent No.: US 7,889,005 B2
(45) Date of Patent: Feb. 15, 2011

(54) CONTROLLABLE AMPLIFIER AND THE USE THEREOF

(75) Inventor: Martin Simon, Otterfing (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/358,623

(22) Filed: Feb. 21, 2006

(65) Prior Publication Data
US 2006/0202760 A1 Sep. 14, 2006

(30) Foreign Application Priority Data
Feb. 23, 2005 (DE) .................. 10 2005 008 372

(51) Int. Cl.
*H03F 3/45* (2006.01)
(52) U.S. Cl. ..................... 330/254; 330/311
(58) Field of Classification Search ................ 330/252, 330/254, 260, 285
See application file for complete search history.

(56) References Cited

U.S. PATENT DOCUMENTS

| | | | |
|---|---|---|---|
| 5,923,217 A | 7/1999 | Durec | |
| 6,496,067 B1 * | 12/2002 | Behzad et al. | 330/261 |
| 6,724,235 B2 * | 4/2004 | Costa et al. | 327/378 |
| 7,057,457 B2 * | 6/2006 | Irvine et al. | 330/252 |
| 7,129,787 B1 * | 10/2006 | Nilson | 330/311 |
| 7,161,429 B2 * | 1/2007 | Boreysha et al. | 330/311 |
| 7,323,937 B2 * | 1/2008 | Ooya et al. | 330/295 |
| 2005/0174175 A1 * | 8/2005 | Heigelmayer et al. | 330/254 |
| 2006/0202751 A1 * | 9/2006 | Stephelbauer et al. | 330/51 |
| 2006/0208802 A1 * | 9/2006 | Minichshofer | 330/289 |

FOREIGN PATENT DOCUMENTS

| | | |
|---|---|---|
| JP | 59012603 A | 1/1984 |
| JP | 2000114891 A | 4/2000 |
| JP | 2001-014891 A | 1/2001 |
| JP | 2002-141758 A | 5/2002 |
| JP | 2002-335135 A | 11/2002 |
| JP | 2003-008373 A | 1/2003 |
| WO | WO 2004-008630 A2 | 1/2004 |

OTHER PUBLICATIONS

"Halbleiter-Schaltungstechnik", Dr. Ing. Ulrich Tietze and Dr. Christoph Schenk, 11, Auflage, Berlin, Springer 1999, pp. 346-347.
"Advanced Integrated Circuits for Communications", Robert G. Meyer, Course Notes, University of Berkeley, EECS242, Lecture 26, 3 pgs.

* cited by examiner

*Primary Examiner*—Hieu P Nguyen
(74) *Attorney, Agent, or Firm*—Eschweiler & Associates, LLC

(57) ABSTRACT

A controllable amplifier amplifies a radiofrequency input signal on the basis of a control signal. A current path is formed between a supply potential connection and a reference potential connection. The current path includes an amplifier transistor and a cascode transistor, the cascode transistor being connected to the input for supplying the control signal. The output power of the amplifier is controlled using the cascode transistor, as a result of which a low power consumption is achieved in conjunction with good noise properties.

18 Claims, 4 Drawing Sheets

CONTROLLABLE AMPLIFIER AND THE USE THEREOF

REFERENCE TO RELATED APPLICATIONS

This application claims the benefit of the priority date of German application DE 10 2005 008 372.2, filed on Feb. 23, 2005, the contents of which are herein incorporated by reference in their entirety.

FIELD OF THE INVENTION

The present invention relates to a controllable amplifier, to a regulator arrangement having the controllable amplifier and to the use of a controllable amplifier.

BACKGROUND OF THE INVENTION

Controllable amplifiers are used, for example, in mobile radio technology. There, the output power of a transmitter in systems having linear modulation methods is controlled or regulated using the input power of the power output stage. Linear modulation methods are used, for example, in the UMTS (Universal Mobile Telecommunications System) and GSM/EDGE (Global System for Mobile Communication/ Enhanced Data Rate for GSM Evolution) mobile radio systems.

In order to avoid sudden changes in the gain, it is desirable to control the output power in proportion to an analog control voltage rather than in discrete steps. Amplifiers of this type are referred to as voltage controlled gain amplifiers (VGAs). The characteristic variables of a VGA are not only the output power which can be achieved but also undesirable intermodulation, the noise properties and the power consumption, the latter in portable applications, in particular. In order to satisfy these requirements, bipolar circuit technologies have hitherto normally been used to implement VGAs. In this case, the noise of the transmitter is reduced to required values, with a relatively large outlay in terms of costs and chip area, using a surface acoustic wave (SAW) filter.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

Embodiments of the invention include a controllable amplifier which, on the basis of its characteristic variables, is suited to use in modern mobile radio systems and in which it is possible to dispense with a surface acoustic wave filter at the output. Additionally, embodiments of the invention relate to the provision of a regulator arrangement having the controllable amplifier and to the use of the latter in a radiofrequency transmission arrangement.

In accordance with one embodiment, a controllable amplifier is provided. The amplifier includes an input for supplying a radiofrequency input signal, an input for supplying a control signal for the gain and an output. A current path is connected between a supply potential connection and a reference potential connection. The current path comprises an amplifier transistor having a controlled path which, at a first connection, is coupled to the reference potential connection and having a control input which is coupled to the input for supplying the radiofrequency input signal for the controllable amplifier. Additionally, the current path comprises a cascode transistor having a control input which is coupled to the input for supplying the control signal for the controllable amplifier and having a controlled path, a first connection of which is coupled to the output of the controllable amplifier and a second connection of which is coupled to a second connection of the amplifier transistor.

In accordance with another embodiment a regulator arrangement is provided. An auxiliary current path comprises a first auxiliary transistor and a second auxiliary transistor. Controlled paths of the first and second auxiliary transistors form a series circuit. A control input of the first auxiliary transistor is connected to the control input of the amplifier transistor and a control input of the second auxiliary transistor is connected to the control input of the cascode transistor. An output connection of the auxiliary current path is coupled to the control input of the second auxiliary transistor so as to form a feedback path. The input for supplying a control signal for the gain of the controllable amplifier is formed in the feedback path.

In one embodiment of the invention, a controllable amplifier is employed as a controllable radiofrequency amplifier in a radiofrequency transmission arrangement.

According to the proposed principle, the amplifier transistor is used to amplify a radiofrequency input signal. The cascode transistor is used to control the level of the output power on the basis of a control signal. In this case, the cascode transistor is arranged between the amplifier transistor and the output of the controllable amplifier in a common current path.

The cascode transistor accordingly can performs multiple functions. On the one hand, the conventional cascode function is implemented. In this case, the cascode transistor forms a cascode stage with respect to the amplifier transistor. This is used, inter alia, to avoid the Miller effect.

On the other hand, and in contrast to a conventional cascode transistor, the control input of the proposed cascode transistor is not, however, connected to a fixed potential but rather a control signal which is used to set the gain is supplied to the control input of the cascode transistor. The output power of the controllable amplifier is thus produced on the basis of the value which is applied to the control input of the cascode transistor.

The control signal can be an analog signal.

The analog control signal can be an analog control voltage so that the proposed controllable amplifier is used to construct a so-called VGA (voltage controlled gain amplifier).

The cascode transistor and the amplifier transistor can be unipolar transistors.

In the case of the proposed controllable amplifier, the drain/ source resistance of the cascode transistor is large when the gate voltage is small. The voltage drop across the transistor reduces the drain/source voltage of the amplifier transistor and the output current of the amplified signal. The transistors (particularly the cascode transistor) are operated in the linear region in such a manner that the output power of the amplifier can be controlled over a wide dynamic range without distortion occurring in this case.

The proposed amplifier arrangement can be implemented with a small number of components. The cascode transistor which controls the gain does not generate substantial additional noise, with the result that the signal-to-noise ratio (SNR) is typically large. This makes it possible, with additional advantage, to dispense with a cost-intensive and area-intensive surface acoustic wave filter.

The operating current through the amplifier transistor is reduced in proportion to the signal current. The proposed circuit thus operates in such a manner that it can save substantial amounts of power. This also applies when only a low output power is required.

According to the proposed principle, the output current of the amplifier transistor is controlled using the cascode transistor. A VGA (voltage controlled gain amplifier) is thus formed. The drain/source voltage of the amplifier transistor is smaller than the differential voltage of the gate voltage and the threshold voltage of a metal oxide semiconductor (MOS) transistor over a wide range, namely the modulation range of the desired application. The amplifier is thus operated in the linear region of a MOS transistor characteristic curve. The drain current is thus directly proportional to the gate voltage. No distortion occurs.

On account of the design of the proposed amplifier arrangement, manufacturing fluctuations in the semiconductor process, dips in the supply voltage and temperature changes have only a slight influence on the properties of the amplifier.

A means for connecting an electrical load can be provided between the supply potential connection and the first connection of the cascode transistor.

The controllable amplifier can include a means for supplying a bias signal, which means is connected to the control input of the amplifier transistor.

In this case, provision is can be made of a current mirror which comprises an input transistor and an output transistor. The amplifier transistor can also operate as the output transistor of the current mirror. The input of the input transistor (which is normally connected as a diode in the case of a current mirror) is connected to a bias current source.

In another embodiment, the means for supplying a bias signal alternatively or additionally comprises a coupling-in element. This coupling-in element couples the input for supplying the radiofrequency input signal for the controllable amplifier to the control input of the amplifier transistor.

In the case of the bias supply being implemented with a current mirror, the coupling-in element can be connected between a control connection of the input transistor and the control connection of the amplifier transistor.

The coupling-in element may, for example, comprise a resistor, which couples a control connection of the input transistor to a control connection of the amplifier transistor, and a series capacitance, which couples the input for supplying the radiofrequency input signal for the controllable amplifier to the control input of the amplifier transistor.

In another development of the proposed principle, in an alternative embodiment for the supply of the bias signal, the means for supplying the bias signal is arranged in the current path which also comprises the cascode transistor and the amplifier transistor. In this case, the means for supplying the bias signal can be arranged at the base point of the amplifier transistor, that is to say between a connection of the controlled path of the amplifier transistor and a reference potential connection.

The proposed controllable amplifier may be designed using a so-called single-ended technique, that is to say to route the useful signal on a single line. Alternatively, however, the arrangement may also be designed using symmetrical circuit technology.

The controllable amplifier may be designed to route differential signals in which the actual information content is available by subtracting the signal elements on two lines. This includes the current path being designed to route differential signals and thus comprising a first current path and a second current path. The first current path comprises a first series circuit comprising the amplifier transistor and the cascode transistor. The second current path comprises a second series circuit comprising a further amplifier transistor and a further cascode transistor. The control input of the further cascode transistor is connected to the control input of the cascode transistor and to the input for supplying the control signal for the amplifier. The input for supplying a radiofrequency input signal is coupled to the control input of the first amplifier transistor and to the control connection of the further amplifier transistor for the purpose of supplying a differential input signal. The output is in the form of a differential output and is coupled to a respective connection of the cascode transistor and of the further cascode transistor.

Accordingly, the radiofrequency input signal is amplified using a differential amplifier comprising the first amplifier transistor and the further amplifier transistor. The two cascode transistors are used to control the total gain and thus the output power.

In order to convert the differential output signal into a single-ended output signal, a so-called balun may be connected to the differential output, which balun converts the symmetrical signal into a signal which can be carried on a line.

When the gate voltage is small, the drain/source resistance of the two cascode transistors is large. The voltage drop across these transistors reduces the drain/source voltage of the amplifier transistors and the signal output current. The transistors are operated in the linear region in such a manner that the output power can be controlled over a wide dynamic range without undesirable distortion occurring in this case. Even when using differential circuit technology, the amplifier can be implemented with a relatively simple design and, in particular, with a small number of components. Since the cascode transistors which control the gain do not generate additional noise, the signal-to-noise ratio is large. It is possible to dispense with a cost-intensive and area-intensive surface acoustic wave filter between the output of the amplifier and an RF output, for example an antenna. Since the operating current through the two amplifier transistors is reduced in proportion to the signal current of the signal to be amplified, the circuit operates in such a manner that it saves a lot of power, even when the output power is low.

The controllable amplifier can be integrated using unipolar semiconductor circuit technology. The transistors, namely the cascode transistor and the amplifier transistor or, in the case of a differential embodiment, the cascode transistors and the amplifier transistors, as well as additional components which may be present can be designed using MOS circuit technology.

When the controllable amplifier is used as a controllable radiofrequency amplifier in a radiofrequency transmission arrangement, provision may be made for the output power to be generated using distributed amplifiers. A further controllable amplifier may thus also be additionally provided in the baseband, that is to say upstream of frequency conversion to radio frequency.

In order to form a regulating circuit, provision may be made of an auxiliary current path which comprises two auxiliary transistors. The controlled paths of the two auxiliary transistors are connected to one another in a series circuit and, in the current path formed in this manner, correspond to that current path which comprises the cascode transistor and the amplifier transistor. The control connection of one of the two auxiliary transistors is connected to the control connection of the amplifier transistor, and the control connection of the other auxiliary transistor is connected to the control connection of the cascode transistor. A feedback path connects an output of the auxiliary current path to the control input of that auxiliary transistor whose control input is connected to the control input of the cascode transistor. The feedback path may contain a differential amplifier at which the control input for supplying the control signal for the gain is formed as a desired signal for the regulating circuit.

The regulating circuit can be used to improve stability. This regulator arrangement can be employed when only a low output power is to be supplied, particularly in combination with the embodiment of the amplifier transistor as part of a current mirror.

In this case, the auxiliary path having the two auxiliary transistors is can be in the form of a further output path of the current mirror, the output paths of the current mirror having a common input transistor.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

The invention will be explained in more detail below using a plurality of exemplary embodiments and with reference to drawings.

DETAILED DESCRIPTION OF THE INVENTION

Figure 1:
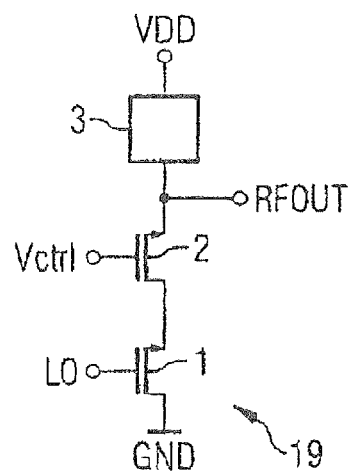
FIG. 1 shows one embodiment of a controllable amplifier according to the proposed principle.

One or more aspects and/or embodiments of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, known structures and devices are shown in block diagram form in order to facilitate describing one or more aspects of the present invention.

FIG. 1 shows a controllable amplifier having an input LO for supplying a radiofrequency input signal and having an output RFOUT at which an output signal which is derived from the radiofrequency input signal and has been amplified is provided. In addition, an input VCTRL which is designed to supply a control signal for prescribing the desired gain is formed. A current path is connected between a supply potential connection VDD and a reference potential connection GND. The current path comprises a series circuit comprising (starting from the reference potential connection GND) an amplifier transistor 1, a cascode transistor 2 and a means for connecting an electrical load 3. In one example, the cascode transistor 2 and the amplifier transistor 1 are each designed as a field effect transistor using metal oxide semiconductor (MOS) circuit technology. The controlled paths of these transistors 1, 2 form a series circuit between the output RFOUT and the reference potential connection GND. The means for connecting the electrical load 3 is connected between the supply potential connection and the output RFOUT. Whereas the input VCTRL for supplying a control signal for the desired gain is connected to the control connection of the cascode transistor 2, the input for supplying a radiofrequency signal LO is connected to the control input of the amplifier transistor 1.

A radiofrequency input signal LO is amplified using the amplifier transistor 1. In this case, the cascode transistor 2 is used to control the gain and thus the output power. In contrast to conventional cascode transistors, the cascode transistor thus has a variable control potential rather than a constant control potential.

In one embodiment, the transistors 1, 2 are operated in the linear region in such a manner that the output power can be controlled over a wide dynamic range without distortion occurring. Since the cascode transistor 2 which controls the gain does not generate additional noise, it is possible to dispense with a complicated surface acoustic wave filter at the output RFOUT. Since the operating current through the amplifier transistor 1 is reduced in proportion to the signal current, the circuit operates in such a manner that it saves a lot of power, even when the output power is low.

Figure 2:
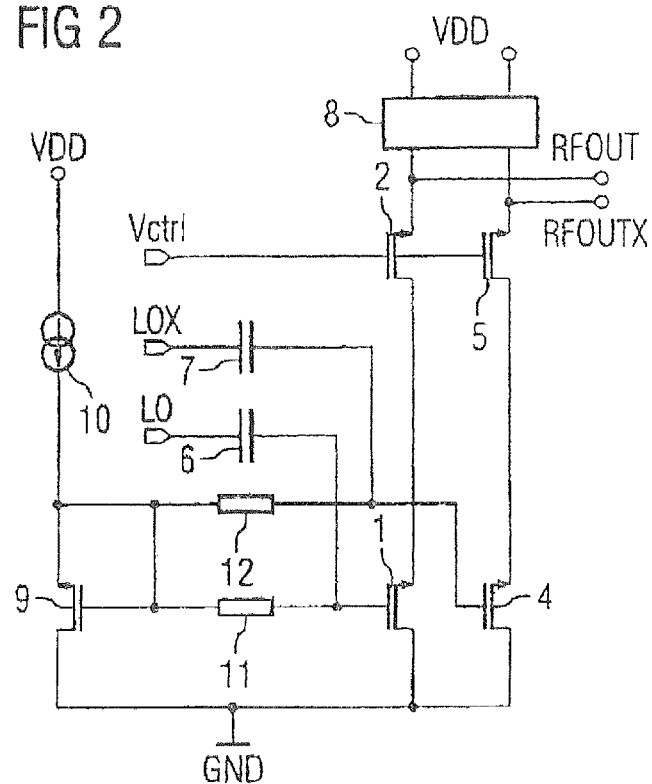
FIG. 2 uses an example to show a development of the circuit shown in FIG. 1.

FIG. 2 shows a development of the controllable amplifier shown in FIG. 1 which is designed for differential signal processing. A means for supplying a bias signal is also provided. Where the circuit shown in FIG. 2 corresponds to that shown in FIG. 1, the description of the connection and its method of operation will not be repeated again at this juncture. Specifically, in the arrangement shown in FIG. 2, provision is made, in addition to the amplifier transistor 1 and the cascode transistor 2, of a further amplifier transistor 4 and a further cascode transistor 5 whose controlled paths likewise form a series circuit. This further series circuit 4, 5 is connected between the output RFOUTX and the reference potential connection GND. A differential input LO, LOX is formed in order to supply the radiofrequency input signal, said input being connected to a respective gate connection of the amplifier transistors 1, 4 via a respective series capacitance 6, 7. The input VCTRL for supplying the control signal for the gain is not only connected to the control input of the cascode transistor 2 but also to the control input of the further cascode transistor 5. The output for tapping off the amplified signal RFOUT, RFOUTX is likewise in the form of a differential signal output in the present case, a respective terminal of the output being formed at a respective connection of the controlled paths of the cascode transistors 2, 5. In addition, the output RFOUT, RFOUTX having a symmetrical means for connecting an electrical load 8 is connected to a supply potential connection VDD.

A current mirror which comprises an input transistor 9 is formed in order to supply a bias signal for setting the operating point of the amplifier transistors 1, 4. The input transistor 9 of the current mirror is connected as a diode by virtue of its source connection being connected to its gate connection. The drain connection is connected to the reference potential connection GND. The supply potential connection VDD is also connected to the source connection of the input transistor 9 via a bias current source. The bias current source is provided with reference symbol 10. The gate connection of the input transistor 9 is also connected, via a respective coupling resistor 11, 12, to a respective control input of the amplifier transistors 1, 4 for the purpose of supplying the bias signal. A current mirror 9, 1, 4 having an input path and two output paths is thus formed. In this case, the coupling-in element which is formed in the current mirror and is intended to inject the radiofrequency input signal comprises the two resistors 11, 12 and the two series capacitances 6, 7. The operating point of the amplifier transistors 1, 4 is thus set using the current mirror ratio and the bias current from the generator 10, while the radiofrequency signal is injected via the capacitances 6, 7 and is appropriately superimposed. In FIG. 2, the magnitude of the bias current is obtained as the product of the current provided by the current source 10, the translation ratio of the current mirrors and Kirchhoff's first law.

Figure 3:
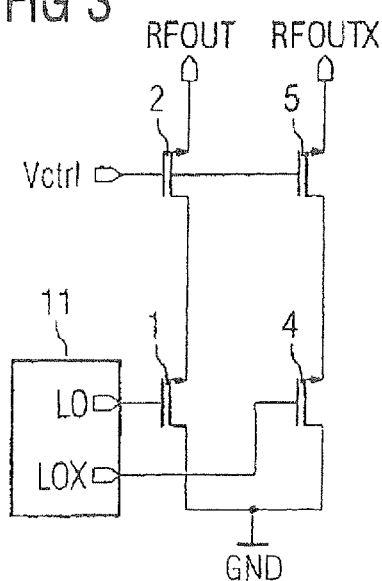
FIG. 3 uses a second example to show a development of the circuit shown in FIG. 1.

FIG. 3 shows, by way of example, another possible way of setting the quiescent current. In that case, a differential signal can be supplied to the differential input which is intended to supply the radiofrequency signal LO, LOX and is directly connected to the gate connections of the amplifier transistors 1, 4. Said differential signal comprises not only the radiofrequency component but also already a bias component for setting the operating points of the transistors. The signal which has been composed in this manner is generated in a functional block 11 which is connected to the input LO, LOX. In order to avoid repetition, reference is made to FIG. 2 as regards the connection of the input for supplying the control signal VCTRL, the output RFOUT, RFOUTX and the two series circuits each comprising an amplifier transistor and a cascode transistor and as regards the method of operation.

Figure 3A:
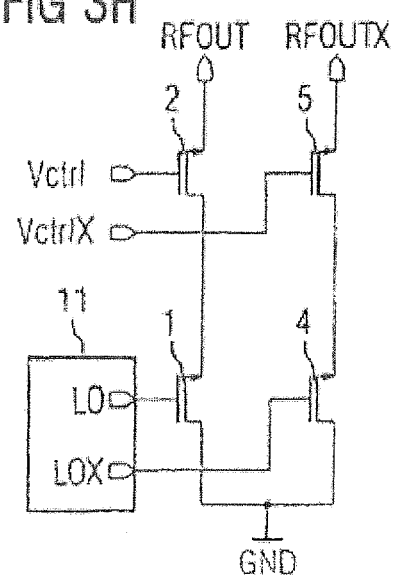
FIG. 3A uses an alternative example, comprising a differential control signal, to show a development of the circuit shown in FIG. 1.

FIG. 3A illustrates an alternative embodiment of the controllable amplifier circuit provided herein. As illustrated in FIG. 3A, first and second cascode transistors 2, 5 comprise inputs configured to receive a respective differential control signal VCTRL or VCTRLX. In one embodiment, the differential control signal VCTRL, VCTRLX may comprise an analog differential control signal that is received at the gate of respective cascode transistors 2, 5.

Figure 4:
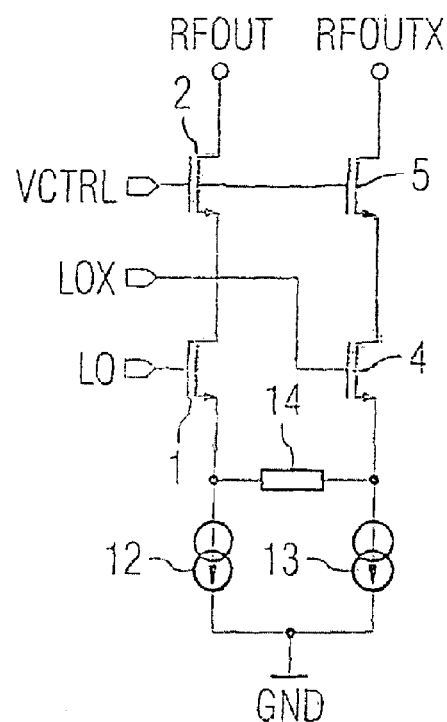
FIG. 4 uses a third example to show a development of the circuit shown in FIG. 1.

FIG. 4 shows another exemplary alternative for generating the bias signal. The design and method of operation of this alternative largely correspond to those of the circuit shown in FIG. 3 but a respective connection of the controlled path of the amplifier transistors 1, 4 is not directly connected to the reference potential connection GND (as is the case in FIG. 3). Rather, provision is made of a bias generating circuit which comprises two current sources and a resistor. Each current source 12, 13 is connected between a connection of the controlled path of the amplifier transistors 1, 4 and the reference potential connection GND. The resistor is connected, as a shunt resistor, on the current source side between the two connections of the controlled paths of the amplifier transistors 1, 4. The resistor bears reference symbol 14. In contrast to FIG. 3, the bias current is therefore prescribed by the current sources 12, 13 in the circuit shown in FIG. 4 and is not set via the gate connections of the amplifier transistors 1, 4. In FIG. 4, the gate connections of the transistors 1, 4 are used only to supply the radiofrequency input signal.

Figure 5:
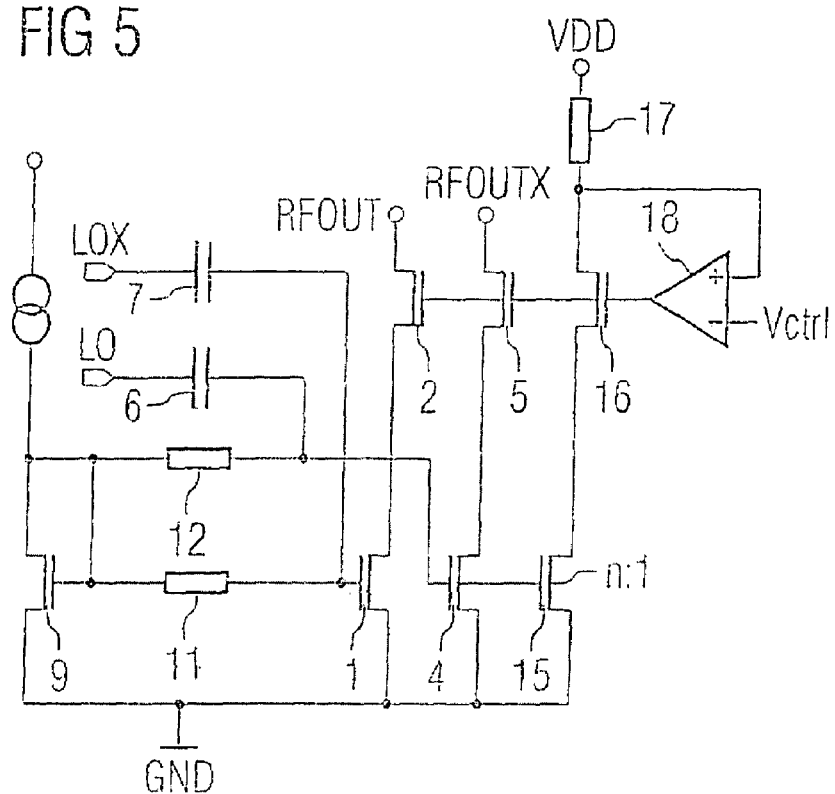
FIG. 5 shows an exemplary development of the circuit shown in FIG. 1 with a regulating circuit.

FIG. 5 shows, by way of example, a development of the circuit shown in FIG. 2 with the provision of a regulator arrangement having the controllable amplifier. Where the circuit shown in FIG. 5 corresponds to that shown in FIG. 2, the description thereof shall not be repeated at this juncture in order to avoid repetition. In the present case, provision is additionally made of an auxiliary current path which comprises a first auxiliary transistor 15 and a second auxiliary transistor 16. The auxiliary current path also comprises a resistor 17, the resistor 17, the controlled path of the second auxiliary transistor 16 and the controlled path of the first auxiliary transistor 15 forming, in this order, a series circuit between the supply potential connection VDD and the reference potential connection GND. The current mirror is thus provided with a further output path on which a signal which is proportional to the output signal and is used as an actual signal for the regulating circuit is provided.

The actual output of the regulating circuit is formed between the second auxiliary transistor 16 and the resistor 17 and is connected to the inverting input of a differential amplifier 18. The noninverting input of the differential amplifier 18 forms the input VCTRL for supplying the control signal for the gain. The output of the differential amplifier 18 is connected to the control inputs of the cascode transistors 2, 5 but also to the control input of the second auxiliary transistor 16.

In the present example, the auxiliary current path having the transistors 15, 16 (which are the auxiliary transistors) has been scaled down with respect to the other current paths having amplifier and cascode transistors 1, 2; 4, 5. This means that the channel width to channel length ratios W/L of the auxiliary transistors 15, 16 have been reduced by a factor of n, which can result in the regulating circuit having a reduced power requirement.

In particular, when the output power of the controllable amplifier is low, that is to say when the voltage level of the control signal VCTRL is low, setting of the operating point using the current mirror is considerably improved.

Figure 6:
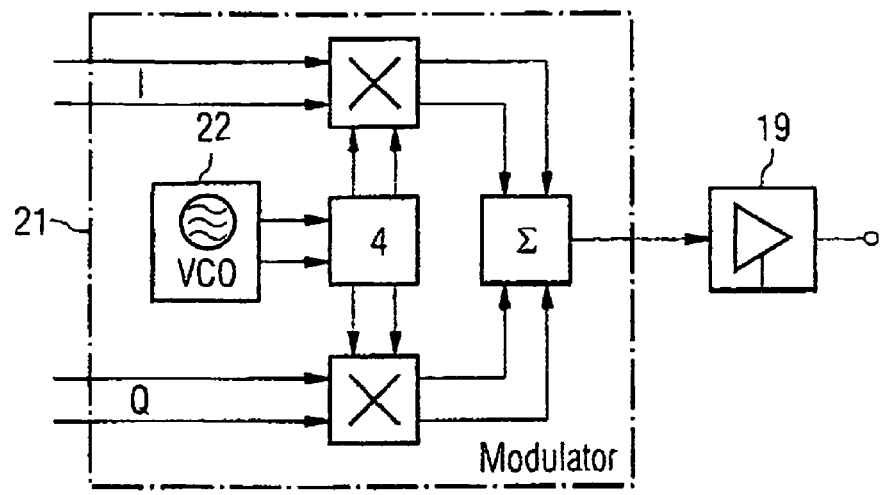
FIG. 6 shows an exemplary use of an amplifier circuit according to the proposed principle in a transmitter.

FIG. 6 shows an application example of a controllable amplifier according to one of the examples shown in FIGS. 1 to 5 in a mobile radio transmission arrangement. In this case, the controllable amplifier provided with reference symbol 19 is connected to the output of a vector modulator. At the baseband end, the vector modulator 21 comprises an inphase input I and a quadrature input Q (which has a phase offset of 90 degrees with respect to the latter) for providing complex signal processing which is customary in the case of digital modulation methods and a wide bandwidth. The vector modulator 21 is used to convert the frequency of the baseband signals to a carrier frequency which is provided by an oscillator 22 and is supplied to the mixers with the correct phase of 0/90 degrees. A summation which forms the output of the vector modulator 21 is effected at the output of the mixers. The advantages of the proposed principle such as the ability to dispense with the surface acoustic wave filter, a low power requirement, good noise properties and low intermodulation can be used in a transmission arrangement, particularly in mobile radio. A power output stage having a constant gain may be connected between the controllable amplifier 19 and an antenna. Alternatively, the controllable amplifier may also itself be in the form of a controllable power output stage and may be coupled to the antenna without additional amplifiers.

Figure 7:
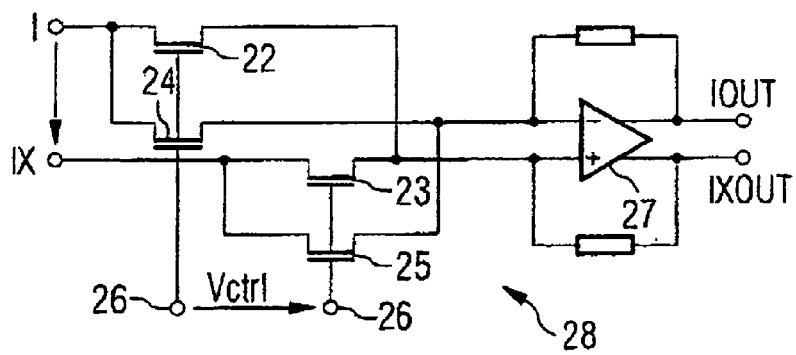
FIG. 7 shows one embodiment of a controllable baseband amplifier.

FIG. 7 shows an exemplary embodiment of a baseband amplifier having a controllable gain in the form of a low-frequency amplifier. The latter comprises, as amplifier transistors, a differential mixer structure having two cross-coupled transistor pairs 22, 23; 24, 25 which are designed, in the present case, using MOS circuit technology. Each transistor 22, 23 of a first transistor pair and each transistor of the further transistor pair 24, 25 are connected to a connection of a symmetrical signal input I, IX. The control connections of the transistors 22, 24 which are connected to the connection I are connected to one another and form a first connection of a differential control input 26. The control inputs of the transistors 23, 25 which are connected to the complementary connection IX form a further connection of the control input 26 which, in the present case, is used to supply the control signal for the gain VCTRL. An amplifier 27 in which resistors provide feedback is connected between the output of the mixer structure (comprising the two transistor pairs 22, 23; 24, 25) and an output IOUT, IXOUT.

Figure 8:
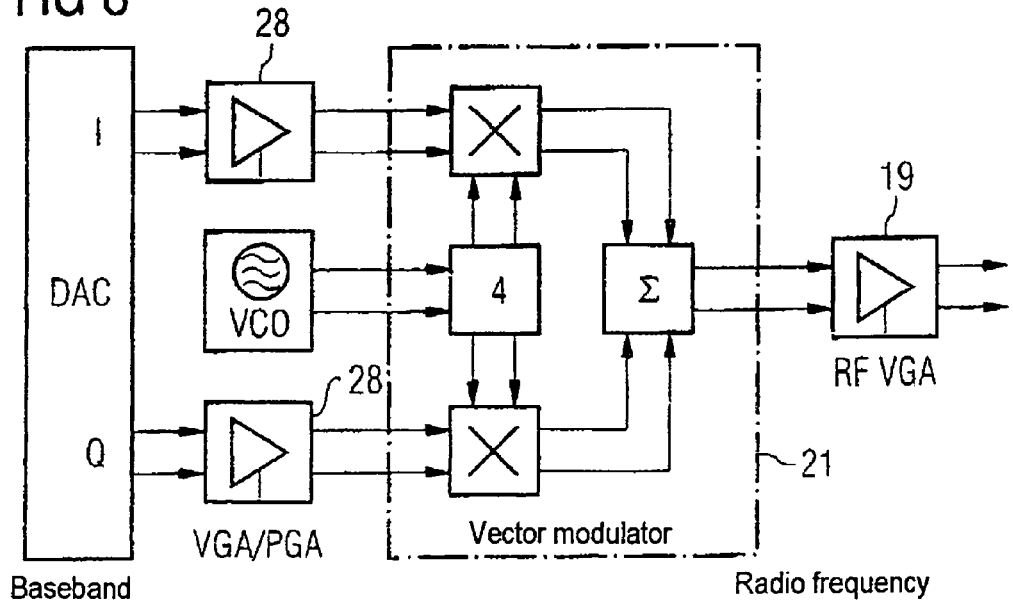
FIG. 8 shows a use of the controllable baseband amplifier shown in FIG. 7 in a development of the transmitter shown in FIG. 6.

FIG. 8 shows an application example of the baseband amplifier which is shown in FIG. 7 and is provided with reference symbol 28. Such a baseband amplifier is respectively connected, as an amplifier which can be controlled in a linear manner, between the inphase and quadrature outputs of a digital/analog converter in the baseband module of a transmitter and a respective inphase and quadrature input of a vector modulator 21. In this case, the design and method of operation of the vector modulator 21 correspond to those of the circuit shown in FIG. 6 and are not described again here. Since a respective controllable amplifier 28, 19 is thus provided in the baseband and at the radiofrequency end, it is possible to divide the total gain between the baseband and the radiofrequency level, thus enabling, in the present case, a respective analog control voltage and thus making it possible to control the gain and the output power in proportion to a control signal. This is used to achieve greater linearity and a wider dynamic range. The total gain is divided between the baseband and the radiofrequency end depending on the application. It goes without saying that a discrete stepwise gain may be provided, within the scope of the invention, in the baseband or radiofrequency amplifier 28, 19.

Figure 9:
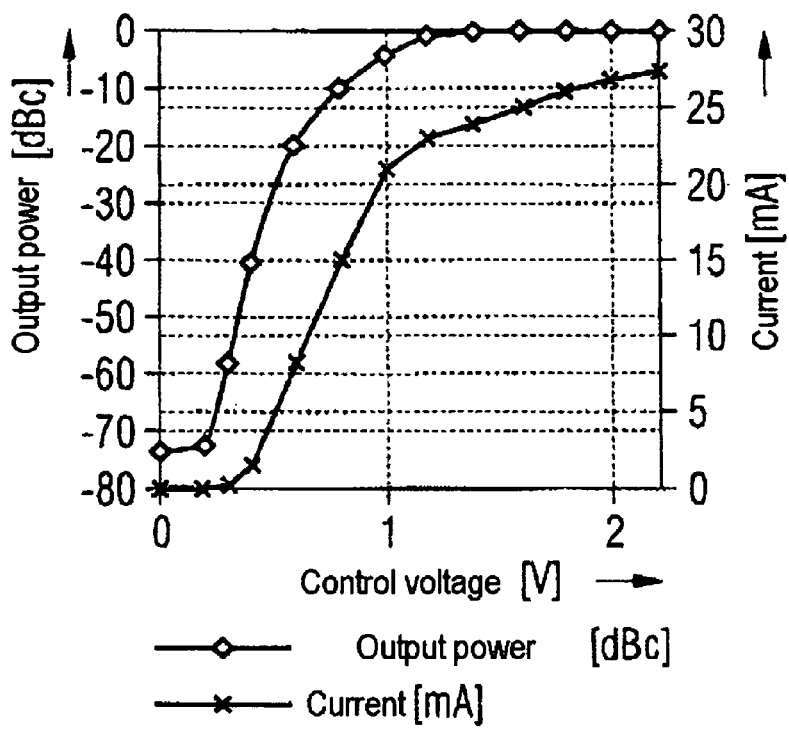
FIG. 9 uses an exemplary graph to show a VGA characteristic curve according to the proposed principle.

FIG. 9 uses an exemplary graph to show both the output power and the current plotted as a function of the control voltage which controls the gain and thus the output power. It can be seen that the characteristic curve of the controllable amplifier is linear over a wide range and can be controlled over a wide dynamic range of over 70 dBc. The power consumption is low in this case.

Figure 10:
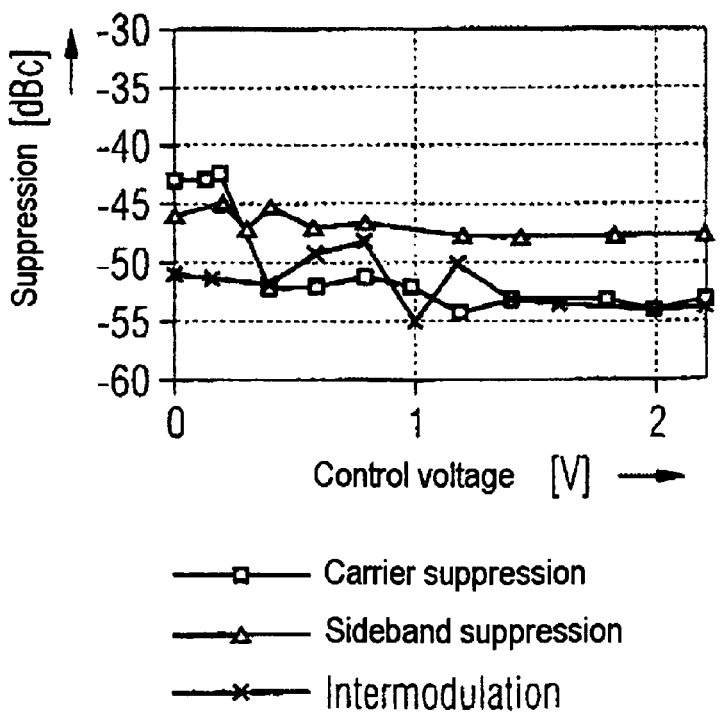
FIG. 10 uses an exemplary graph to show the intermodulation, the sideband suppression and the carrier suppression in a proposed amplifier.

FIG. 10 uses an exemplary graph to show (likewise as a function of the control voltage) the carrier suppression, the sideband suppression and the intermodulation in the proposed controllable amplifier. In this case, a fixed input power was assumed. The amplitude of the lower sideband in dBc and the carrier signal in dBc are virtually constant against the control voltage.

The greatest distortion in the characteristic curve occurs in the central region. Reducing the input power by 1 to 2 dB makes it possible to reduce the intermodulation and to dimension the VGA for more maximum output power and less bias current. The amplitude of a digital/analog converter for the baseband signal (as shown in FIG. 8) can be reduced by programming a programmable amplifier or by connecting a baseband VGA having a narrow dynamic range upstream (see FIG. 7).

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims.

In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

What is claimed is:

1. A controllable amplifier comprising:
   a first input configured to receive a radiofrequency input signal;
   a second input configured to receive an analog control signal for gain;
   an output; and
   a current path connected between a supply potential connection and a reference potential connection, wherein the current path comprises:
   an amplifier transistor having a first connection coupled to the reference potential connection, a second connection, and a control input coupled to the first input;
   a cascode transistor having a control input coupled to the second input, a first connection coupled to the second connection of the amplifier transistor, and a second connection coupled to the output, wherein the cascode transistor is configured to operate over a plurality of different, non-zero gains in an analog fashion based on the analog control signal provided at the control input thereof, wherein the analog control signal is operable to adjust the gain of the cascode transistor in the analog fashion;
   an auxiliary current path comprising a first auxiliary transistor, a second auxiliary transistor, an output, and a feedback path, wherein the first auxiliary transistor comprises a control input, the second auxiliary transistor comprises a control input, and the first auxiliary transistor and the second auxiliary transistor are connected in series;
   wherein the control input of the first auxiliary transistor is connected to the control input of the amplifier transistor;
   wherein the output of the auxiliary current path is connected to a first connection of the second auxiliary transistor; and
   wherein the feedback path of the auxiliary current path is connected to the output of the auxiliary current path and the second input.

2. The controllable amplifier of claim 1, further comprising an electrical load connected to the supply potential connection and the second connection of the cascode transistor.

3. The controllable amplifier of claim 1, further comprising a means for supplying a bias signal connected to the control input of the amplifier transistor.

4. The controllable amplifier of claim 3, wherein the means for supplying the bias signal comprises a current mirror having an input transistor connected to a current source and the amplifier transistor.

5. The controllable amplifier of claim 3, wherein the means for supplying the bias signal comprises
a coupling-in element that couples the control input of the amplifier transistor to the first input.

6. The controllable amplifier of claim 5, wherein the coupling-in element is connected to an input transistor and the control input of the amplifier transistor.

7. The controllable amplifier of claim 1, further comprising a means for supplying a bias signal arranged in the current path and connected to the first connection of the amplifier transistor.

8. The controllable amplifier of claim 1, wherein the radiofrequency input signal is a differential signal and the output provides an output signal as a differential signal.

9. A controllable amplifier comprising:
first and second amplifier transistors having inputs configured to receive a differential input signal, and first and second connections;
first and second cascode transistors having inputs configured to receive a respective one of an analog differential control signal, and first and second connections, wherein the differential input signal is independent of the respective one of the analog differential control signal;
wherein the first connection of the first amplifier transistor is connected to the second connection of the first cascode transistor and the first connection of the second amplifier transistor is connected to the second connection of the second cascode transistor; and
wherein the first connection of the first cascode amplifier transistor and the first connection of the second cascode amplifier transistor provide a differential output signal, wherein the first and second cascode transistors are configured to operate over a plurality of different, non-zero gains in an analog fashion based on the analog differential control signal, wherein the analog differential control signal is operable to adjust the gain of the first and second cascode transistors in the analog fashion.

10. The controllable amplifier of claim 9, further comprising a load having a first terminal connected to the first connection of the first cascode amplifier transistor and the first connection of the second cascode amplifier transistor and a second terminal connected to a supply potential connection.

11. The controllable amplifier of claim 9, wherein the differential input signal includes a bias signal.

12. The controllable amplifier of claim 11, further comprising a current mirror that generates the bias signal.

13. The controllable amplifier of claim 11, further comprising a coupling-in element that generates the bias signal.

14. A controllable amplifier comprising:
a plurality of amplifier transistors that receive an input signal and generate an amplified input signal; and
a plurality of cascode transistors, wherein each of the plurality of cascode transistors is connected to a respective one of the plurality of amplifier transistors, that respectively receive the amplified input signal from the respective one of the plurality of amplifier transistors and one portion of an analog differential control signal, and wherein the plurality of cascode transistors are operable over a plurality of different, non-zero gains, and generate an output signal in an analog fashion in response thereto, and wherein the differential control signal is operable to adjust the gain of the plurality of cascode transistors in the analog fashion; and
wherein the output signal has an output power according to the differential control signal; and
wherein the differential control signal is adjusted to a voltage potential that mitigates noise.

15. The controllable amplifier of claim 14, wherein the input signal is a radio frequency input signal.

16. The controllable amplifier of claim 14, further comprising a means for connecting an electrical load to the one or more cascode transistors.

17. The controllable amplifier of claim 14, wherein the output signal also has a gain value according to the differential control signal.

18. A controllable amplifier comprising:
a current mirror to generates a bias signal;
first and second amplifier transistors having inputs configured to receive a differential input signal that includes the bias signal, and first and second connections;
first and second cascode transistors having inputs configured to receive a respective one of an analog differential control signal, and first and second connections;
wherein the first connection of the first amplifier transistor is connected to the second connection of the first cascode transistor and the first connection of the second amplifier transistor is connected to the second connection of the second cascode transistor; and
wherein the first connection of the first cascode amplifier transistor and the first connection of the second cascode amplifier transistor provide a differential output signal, wherein the first and second cascode transistors are configured to operate over a plurality of different, non-zero gains in an analog fashion based on the analog differential control signal, wherein the analog differential control signal is operable to adjust the gain of the first and second cascode transistors in the analog fashion.

\* \* \* \* \*